(12) United States Patent
Parikh

(10) Patent No.: US 8,476,695 B2
(45) Date of Patent: Jul. 2, 2013

(54) SELF ALIGNED NARROW STORAGE ELEMENTS FOR ADVANCED MEMORY DEVICE

(75) Inventor: Suketu Arun Parikh, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 598 days.

(21) Appl. No.: 12/697,707

(22) Filed: Feb. 1, 2010

(65) Prior Publication Data
US 2010/0133605 A1    Jun. 3, 2010

Related U.S. Application Data

(62) Division of application No. 11/746,122, filed on May 9, 2007, now Pat. No. 7,682,905.

(51) Int. Cl.
*H01L 29/792* (2006.01)

(52) U.S. Cl.
USPC .......................................................... 257/324

(58) Field of Classification Search
USPC .......................................... 257/324, E29.309
See application file for complete search history.

(56) References Cited

U.S. PATENT DOCUMENTS

| | | | |
|---|---|---|---|
| 6,306,703 B1 | 10/2001 | Noble | |
| 6,420,273 B1 | 7/2002 | Lin | |
| 6,784,476 B2 * | 8/2004 | Kim et al. | 257/296 |
| 7,388,252 B2 * | 6/2008 | Lung | 257/315 |
| 7,902,589 B2 * | 3/2011 | Ho et al. | 257/324 |
| 8,076,715 B2 * | 12/2011 | Melik-Martirosian | 257/324 |
| 2002/0110974 A1 | 8/2002 | Forbes | |
| 2010/0244117 A1 * | 9/2010 | Prall et al. | 257/316 |

OTHER PUBLICATIONS

International Search Report for PCT/US2008/63186 dated Aug. 4, 2008.
Written Opinion for PCT/US2008/63186 dated Aug. 4, 2008.
Office Action for U.S. Appl. No. 11/746,122 mailed on Oct. 9, 2008.
Office Action for U.S. Appl. No. 11/746,122 mailed on Apr. 3, 2009.
Chinese Office Action mailed Nov. 30, 2012 for Chinese Patent Application No. 200880023742.9, 15 pages.

* cited by examiner

*Primary Examiner* — Fernando L Toledo
*Assistant Examiner* — Neil Prasad
(74) *Attorney, Agent, or Firm* — Turocy & Watson, LLP

(57) ABSTRACT

A method of forming a sub-lithographic charge storage element on a semiconductor substrate is provided. The method can involve providing first and second layers on a semiconductor substrate, a thickness of the first layer being larger than a thickness of the second layer; forming a spacer adjacent a side surface of the first layer and on a portion of an upper surface of the second layer; and removing an exposed portion of the second layer that is not covered by the spacer. By removing the exposed portion of the second layer while leaving a portion of the second layer that is protected by the spacer, the method can make a sub-lithographic charge storage element from the remaining portion of the second layer on the semiconductor substrate.

20 Claims, 9 Drawing Sheets

SELF ALIGNED NARROW STORAGE ELEMENTS FOR ADVANCED MEMORY DEVICE

CROSS-REFERENCE TO RELATED APPLICATION

This application is a Divisional of application Ser. No. 11/746,122 filed May 9, 2007, the entire contents of which is hereby incorporated by reference.

TECHNICAL FIELD

The subject invention generally relates to forming a sub-lithographic charge storage element on a semiconductor substrate for use in connection with a semiconductor structure such as a memory device.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers and to increase the number of layers of such devices on a chip. In order to accomplish such high device packing densities, smaller and smaller features sizes are required. This may include the width and spacing of interconnecting lines, spacing and diameter of contact holes, and the surface geometry, such as corners and edges, of various features.

The process of manufacturing semiconductors, or integrated circuits (commonly called ICs, or chips), typically consists of more than a hundred steps, during which hundreds of copies of an integrated circuit may be formed on a single wafer. Generally, the process involves creating several patterned layers on and into the substrate that ultimately forms the complete integrated circuit. This layering process creates electrically active regions in and on the semiconductor wafer surface.

The requirement of small features with close spacing between adjacent features requires sophisticated manufacturing techniques including dielectric layer deposition and planarization of the dielectric layer. Fabricating a semiconductor structure using such sophisticated techniques may involve a series of steps including cleaning, thermal oxidation or deposition, masking, developing, etching, baking and doping.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a method of forming a sub-lithographic charge storage element on a semiconductor substrate. The method can involve providing a first layer and a second layer on a semiconductor substrate, the first layer having a height larger than a height of the second layer; forming a spacer adjacent a side surface of the first layer and on a portion of an upper surface of the second layer; and removing an exposed portion of the second layer not covered by the spacer. By removing the exposed portion of the second layer while leaving the portion of the second layer protected by the spacer, the method can provide a sub-lithographic charge storage element from the remaining portion of the second layer on the semiconductor substrate.

Another aspect of the subject invention provides a semiconductor structure containing a first layer and a sub-lithographic charge storage element on a semiconductor substrate, the first layer having a height larger than a height of the sub-lithographic charge storage element. The first layer is adjacent the sub-lithographic charge storage element. The sub-lithographic charge storage element contains a charge-trapping material.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
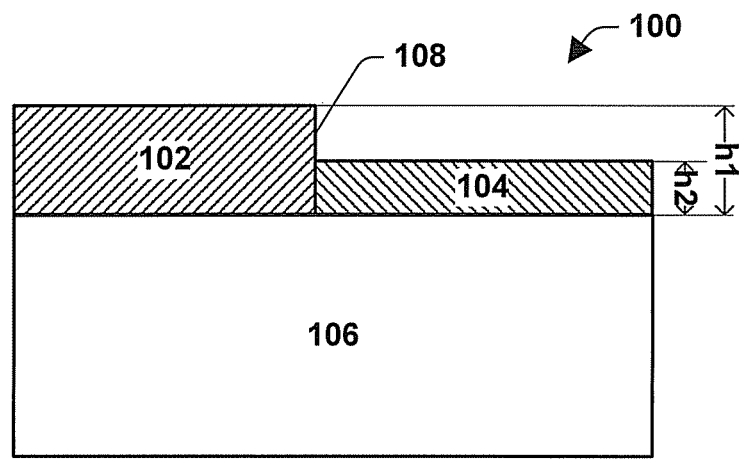
FIG. 1 illustrates a cross sectional view of an intermediate state of a portion of an exemplary semiconductor structure in accordance with an aspect of the subject invention.

The present invention provides methods of forming a sub-lithographic sized charge storage element for a semiconductor structure using spacer formation techniques. The sub-lithographic charge storage element may be formed into any type of electrical structure including a memory cell, such as a non-volatile memory. By removing exposed portions of a layer while leaving a portion of the layer protected by the spacer, the method can provide a narrow portion of the layer, which is a sub-lithographic charge storage element, on a semiconductor substrate. Consequently, the width of the sub-lithographic charge storage element formed is dependent upon spacer formation techniques rather than photolithography techniques. In other words, the width of the sub-lithographic charge storage element is controlled and/or determined mainly by the limitations of spacer formation techniques rather than the limitations of photolithography techniques. As a result, sub-lithographic charge storage elements may be formed in a reliable manner and the sub-lithographic charge storage elements can have dimensions less than the resolution of lithographic exposure tools. The present invention therefore effectively addresses the concerns raised by the trend towards the miniaturization of semiconductor devices.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

Referring to FIGS. 1 to 4 and FIGS. 5 to 13, two of many possible exemplary embodiments of forming a sub-lithographic charge storage element on a semiconductor substrate are illustrated. FIG. 1 illustrates a cross sectional view of an intermediate state of a portion of an exemplary semiconductor structure 100. The semiconductor structure 100 contains a first layer 102 and a second layer 104 on a semiconductor substrate 106.

In one embodiment, the semiconductor structure 100 is portion of a memory device. Examples of memory devices include a volatile memory and a non-volatile memory. Examples of volatile memory include RAM such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM). Examples of non-volatile memory include ROM, PROM, electrically programmable ROM (EPROM), electrically erasable programmable ROM (EEPROM), or flash memory.

The substrate 106 may contain any suitable substrate material on which electric device such as a transistor can be formed. When the semiconductor structure 100 is a portion of a memory device, the semiconductor structure 100 can be either a portion of high-density core regions of a non-volatile memory device or a portion of low-density peripheral regions of a non-volatile memory device. The high-density core region typically includes one or more M×N array cores of individually addressable, substantially identical memory cells. The low-density peripheral region typically includes input/output (I/O) circuitry and circuitry for selectively addressing the individual cells. The selective addressing circuitry typically includes one or more x-decoders and y-decoders, cooperating with the I/O circuitry for connecting the source, gate, and drain region of selected addressed cells to predetermined voltages or impedances to effect designated operations on the cell, e.g., programming, reading and erasing, and deriving necessary voltages to effect such operations.

The first layer 102 contains a material that may be formed into a pattern. Examples of first layer materials include silicon containing materials, such as silicon oxide, silicon nitride and silicon oxynitride; nitrogen rich films; photoresist materials; low K polymer materials; and the like. Low K polymer materials are materials having low dielectric constants and include polyimides, fluorinated polyimides, polysilsequioxane, benzocyclobutene (BCB), parlene F, parlene N and amorphous polytetrafluoroethylene. A specific example of a commercially available low K polymer material is FlareJ from Allied-Signal believed to be derived from perfluorobiphenyl and aromatic bisphenols. In another embodiment, the first layer 102 contains an oxide material such as a high density plasma (HDP) oxide and plasma tetraethyl orthosilicate (TEOS). The first layer 102 can be fabricated by forming the various materials over the substrate 106 via chemical vapor deposition, physical vapor deposition, electroplating or electroless plating, and patterning the various material layers using lithography.

The second layer 104 can be a single-layer structure or a multi-layer structure. The second layer 104 becomes a sub-lithographic charge storage element by removing exposed portions of the second layer in subsequent etching. The second layer 104 can contain any suitable charge storage element. Examples of charge storage elements include silicon nitride, SONOS (silicon-oxide-nitride-oxide-silicon), poly-silicon, ferroelectric materials such as $PZT(Pb(ZrTi)O_3)$ and $PLZT((PbLa)(ZrTi)O_3)$, phase charge materials, and the like.

In one embodiment, the second layer 104 can contain a charge-trapping material such as nitrides, oxides, or silicates. For example, the charge-trapping material contains silicon nitride and/or silicon oxynitride. The silicon nitride charge-trapping layer may be an integrated part of an oxide-nitride-oxide (ONO) tri-layer which is fabricated by forming a first silicon oxide layer, forming a silicon nitride layer on the first silicon oxide layer, and forming a second silicon oxide layer on the silicon nitride layer. In another example, the charge-trapping material contains an oxide or silicate containing Al, Ta, Hf, La, Zr, Ti, Nb, Cr, V, Y, Ce and/or Pr. The second layer 104 can be fabricated by forming the various materials over the substrate 106 via chemical vapor deposition, physical vapor deposition, electroplating or electroless plating, and patterning the various material layers using lithography.

The first layer 102 and second layer 104 are adjacent to each other on the substrate 106. The height (h1) of the first layer 102 is larger than the height (h2) of the second layer 104 at the adjacent area. The top surface of the first layer 102 at the adjacent area is suitably higher than the top surface of the second layer 104 so that an upper portion of the first layer 102 can remain after etching a portion of the second layer 104 in subsequent etching that is described below. Since the top surface of the first layer 102 is higher than the top surface of the second layer 104, the side surface 108 of the first layer 102 is exposed.

The exposed side surface 108 can be employed for forming a spacer in a subsequent act. In one embodiment, the height (h1) of the first layer 102 is larger than the height (h2) of the second layer 104 by about 200 Angstroms or more and about 5,000 Angstroms or less. In another embodiment, the height (h1) of the first layer 102 is larger than the height (h2) of the second layer 104 by about 400 Angstroms or more and about 4,000 Angstroms or less. In yet another embodiment, the height (h1) of the first layer 102 is larger than the height (h2) of the second layer 104 by about 500 Angstroms or more and about 3,000 Angstroms or less.

Figure 2:
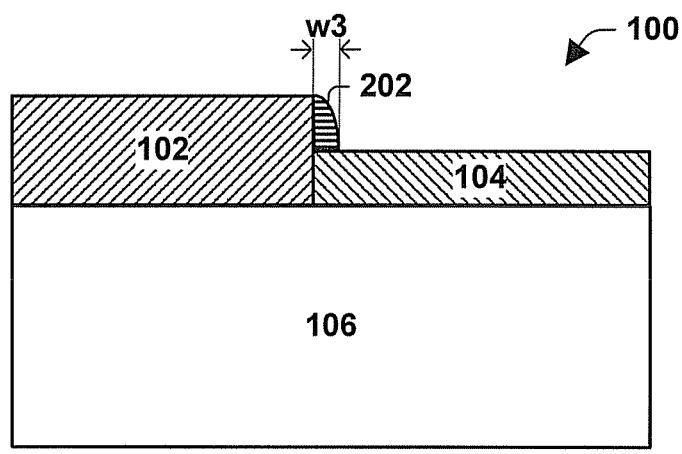
FIG. 2 illustrates forming a spacer adjacent a side surface of a first layer and on a portion of an upper surface of a second layer in accordance with an aspect of the subject invention.

FIG. 2 illustrates forming a spacer 202 adjacent the side surface 108 of the first layer 102 and on a portion of an upper surface of the second layer 104. The spacer 202 can serve as a mask for forming a narrow portion of the second layer 104 in a subsequent act. The spacer 202 can contain any suitable material so that the spacer 202 can serve as a mask for protecting the covered portion of the second layer 104 when removing unmasked portions of the second layer 104 with the spacer 202. That is, the spacer material can be selected so that there is etch selectivity between the second layer 104 and the spacer 202.

The spacer material can have a lower etch rate than the second layer 104 in a subsequent etching process. For example, an etching rate of a nitride material is markedly slower than an etching rate of an oxide material with respect to an oxide etchant. Accordingly, in one embodiment, the spacer 202 contains a nitride material when the second layer 104 contains an oxide material. Examples of nitride materials include silicon oxynitride, silicon nitride, and the like. In another embodiment, diamond-like carbon and/or silicon carbide can be employed as a spacer 202.

The spacer 202 can be formed by any suitable method, for example, forming a layer containing the spacer material over the substrate 106 and then removing portions of the spacer material layer not near the adjacent area of the first and second layers to leave the spacer 202. A layer containing the spacer material can be formed at least over the adjacent area of the first and second layers 102, 104. After forming the spacer material layer, portions of the spacer material layer can be removed, thereby forming a spacer 202. Any suitable etching can be used as long as the etching can leave a spacer 202 adjacent the side surface 108 of the first layer 102 and on a portion of the upper surface of the second layer 104. Width of the spacer corresponds to the width of the subsequently formed sub-lithographic charge storage elements. Examples of etching include reactive ion etching, chemical plasma etching, or other suitable anisotropic etching utilizing a suitable chemistry.

Choice of a suitable process and reagents of etching depends on, for example, the spacer material, the width and thickness of the spacer material, the desired implementations and/or the semiconductor structure 100 being fabricated, and the like. In one embodiment, reactive ion etching is used with an appropriate etchant for the selected spacer material. For example, when the spacer 202 contains silicon nitride, examples of etchants include $CF_4$ or $CHF_3$. In another embodiment, when the spacer 202 contains diamond-like carbon, examples of etchants include oxygen-based plasma. In yet another embodiment, when the spacer 202 contains silicon carbide, examples of etchants include $CF_4$, $CH_2F_2$, or $C_2F_6$.

The spacer 202 can have any suitable width (w3) that depends on, for example, the desired width of the sub-lithographic charge storage element, the desired implementations and/or the semiconductor structure 100 being fabricated. Since the spacer 202 can serve as a mask for protecting a narrow portion of the second layer 104 when etching the exposed portions of the second layer 104 in subsequent etching as described below, the width (w3) of the spacer 202 can control and/or determine a width of the resultant sub-lithographic charge storage element. The width (w3) of the spacer 202 may be reduced during the subsequent etching. When the width (w3) of the spacer 202 is reduced during the subsequent etching, the reduced width of the spacer 202 can control and/or determine a width of the resultant sub-lithographic charge storage element. In one embodiment, the spacer 202 has a width (w3) of about 100 Angstroms or more and about 500 Angstroms or less. In another embodiment, the spacer 202 has a width (w3) of about 150 Angstroms or more and about 400 Angstroms or less. In yet another embodiment, the spacer 202 has a width (w3) of about 200 Angstroms or more and about 300 Angstroms or less.

Figure 3:
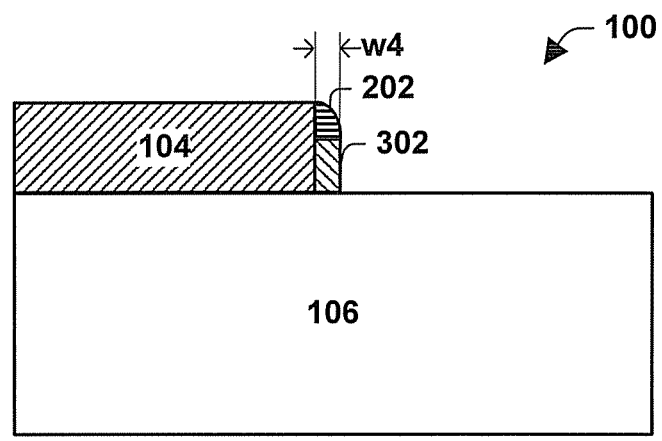
FIG. 3 illustrates forming a sub-lithographic charge storage element on a semiconductor substrate by removing portions of a second layer not covered by a spacer in accordance with an aspect of the subject invention.

FIG. 3 illustrates forming a sub-lithographic charge storage element 302 on the semiconductor substrate 106 by removing the exposed portions of the second layer 104. The sub-lithographic charge storage element 302 can be formed by removing portions of second layer 104 that are not covered with the spacer 202. The spacer 202 can serve as a mask for protecting a narrow portion of the second layer 104 during removing the exposed portions of the second layer 104.

The unmasked or uncovered portions of the second layer 104 can be removed by, for example, etching. Any suitable etching can be employed as long as the etching substantially removes the exposed portion of the second layer 104 but does not substantially remove or damage the portion of the second layer 104 that is covered with the spacer 202. For example, when the spacer 202 contains a nitride material and the second layer 104 contains an oxide material, an oxide etchant such as halogen acids (e.g., hydrofluoric acid) can be employed to form the sub-lithographic charge storage element 302 by removing the exposed portions of the second layer 104.

The sub-lithographic charge storage element 302 can have any suitable width (w4) that depends on, for example, the desired implementations and/or the semiconductor structure 100 being fabricated. Since the sub-lithographic charge storage element 302 is a portion that is protected by the spacer 202, the width (w4) of the sub-lithographic charge storage element 302 can be controlled and/or determined by the width (w3) of the spacer 202. In one embodiment, the sub-lithographic sized charge storage element 302 has a width (w4) of about 100 Angstroms or more and about 500 Angstroms or less. In another embodiment, the sub-lithographic sized charge storage element 302 has a width (w4) of about 150 Angstroms or more and about 400 Angstroms or less. In yet another embodiment, the sub-lithographic sized charge storage element 302 has a width (w4) of about 200 Angstroms or more and about 300 Angstroms or less.

Figure 4:
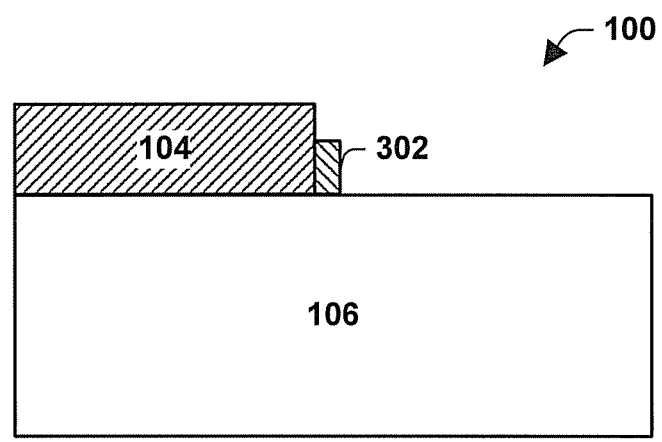
FIG. 4 illustrates removing a spacer from an exemplary semiconductor structure in accordance with an aspect of the subject invention.

FIG. 4 illustrates removing the spacer 202 from the exemplary semiconductor structure 100. The method may or may not involve removing the spacer 202. If necessary, the spacer 202 can be removed by, for example, contacting the spacer 202 with any suitable spacer etchant that does not substantially damage or remove other components or structures of the semiconductor structure 100 such as the sub-lithographic charge storage element 302. For example, when the spacer 202 contains a nitride material and the sub-lithographic charge storage element 302 contains an oxide material, a nitride etchant such as phosphoric acid can be employed to remove the spacer 202 without substantially damaging the sub-lithographic charge storage element 302.

Although not shown, any suitable other layer can be formed on the sub-lithographic charge storage element 302 and/or between the sub-lithographic charge storage elements 302. In one embodiment, a top oxide is formed on the sub-lithographic charge storage element 302. In another embodiment, an oxide material (e.g., HDP oxide and aluminum oxide) is formed around the sub-lithographic charge storage elements 302. In yet another embodiment, a top gate (e.g., poly and tantalum) is formed over the sub-lithographic charge storage element 302.

The method can involve other semiconductor structure fabrication processes. For example, before and/or after forming the sub-lithographic charge storage element 302 on the substrate 106, all or portions of the substrate 106 may be subject to any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures in general and memory devices in particular.

Figure 5:
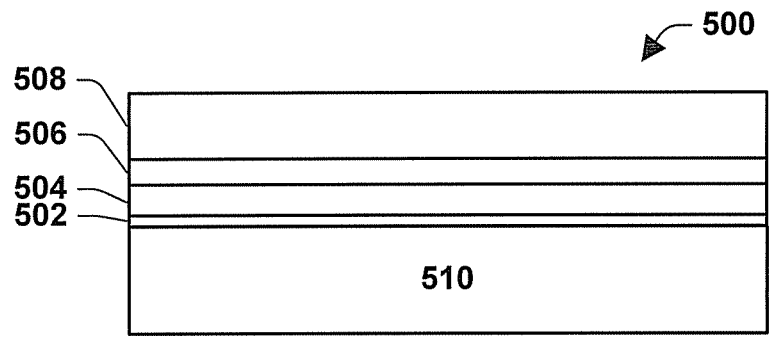
FIG. 5 illustrates a cross sectional view of an intermediate state of a portion of another exemplary semiconductor structure in accordance with an aspect of the subject invention.

FIG. 5 illustrates a cross sectional view of an intermediate state of a portion of another exemplary semiconductor structure 500. The semiconductor structure 500 can contain a first oxide layer 502, a nitride layer 504, a second oxide layer 506, and a first poly layer 508 over a semiconductor substrate 510. The semiconductor structure 500 can further contain other layers/components. In one embodiment, the semiconductor structure 500 contains another oxide layer (e.g., tunnel oxide, not shown) between the first oxide layer 502 and the semiconductor substrate 510.

In this example, the semiconductor structure 500 is a portion of high-density core regions of a non-volatile memory device or a portion of low-density peripheral regions of a non-volatile memory device. The substrate 510 may contain any suitable substrate material on which electric devices such as memory cell transistors can be formed. The first and second oxide layers 502, 506 may contain any suitable oxide material. Examples of oxide materials include silicon oxide. The oxide layers 502, 506 may be provided over at least a portion of the substrate 510. The nitride layer 504 may contain any suitable nitride material. Examples of nitride materials include silicon nitride. The nitride layer 504 can serve as a charge-trapping layer. The first oxide layer 502, nitride layer 504, and second oxide layer 506 may be referred as to as an ONO tri-layer. The first poly layer 508 typically contains polysilicon.

Figure 6:
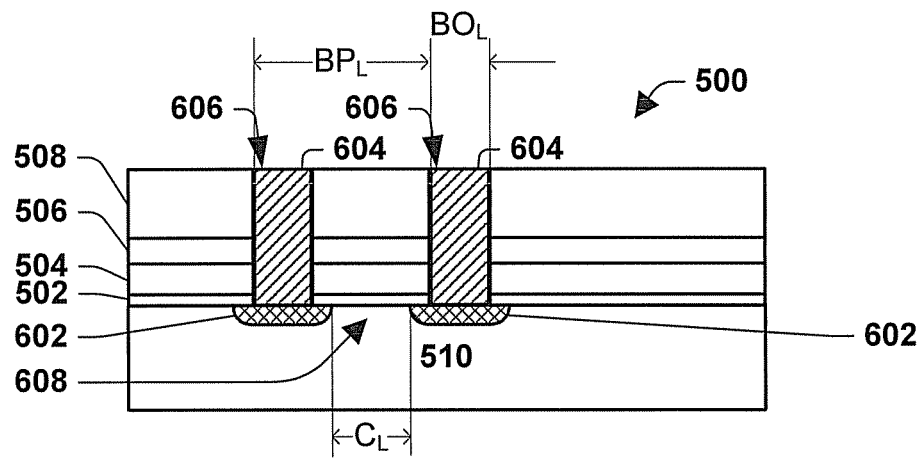
FIG. 6 illustrates forming a first layer on a semiconductor substrate in accordance with an aspect of the subject invention.

FIG. 6 illustrates forming one or more implanted portions 602 and one or more first layers 604 in openings 606 on the semiconductor substrate 510. By forming the implanted portion 602 through the opening 606 and forming the first layer 604 in the opening, the implanted portion 602 is self-aligned to the first layer 604.

The opening 606 can be formed in the first oxide layer 502, nitride layer 504, second oxide layer 506, and first poly layer 508 by employing any suitable technique. For example, the opening 606 can be formed by a lithography process followed by etching. Any suitable etching process can be used for forming the opening 606. For example, a plasma etch can be used to form the opening 606. When the semiconductor structure 500 contains a tunnel oxide between the first oxide layer 502 and the semiconductor substrate 510, the etch removes the portion of the first oxide layer 502, nitride layer 504, second oxide layer 506, and first poly layer 508 to make the opening 606, and stop on the tunnel oxide. The tunnel oxide at the bottom of the opening 606 may be removed later. In another example, the tunnel oxide at the bottom of the opening 606 is also removed when forming the opening 606.

After forming the opening 606 and before forming the first layer 604, one or more implanted portions 602 can be formed in the substrate 510 at the bottom of the opening 606 by any suitable implantation technique such as doping the substrate 510 with implant species (e.g., arsenic, phosphorus, boron, and argon). For example, a double diffusion implant (DDI) and a medium diffused drain (MDD) implant can be formed in the substrate 510. As a result of the implantation, when the semiconductor structure 500 is a portion of a non-volatile memory device, the implanted portion 602 of the substrate 510 may be referred to as a source region or drain region, and some areas of the unimplanted portion 608 of the substrate 510 may be referred to as a channel.

The opening 606 may be referred to as a bitline opening. The length ($BO_L$) of the bitline opening 606 may vary and is not critical to the subject invention. The length ($BO_L$) of the bitline opening 606 can have any suitable length that depends on, for example, the desired length of the sub-lithographic charge storage element, the desired implementations and/or the semiconductor structure 500 being fabricated, and the like. In one embodiment, the length ($BO_L$) of the bitline opening 606 is about 5 nm or more and about 100 nm or less. In another embodiment, the length ($BO_L$) of the bitline opening 606 is about 10 nm or more and about 190 nm or less. In yet another embodiment, the length ($BO_L$) of the bitline opening 606 is about 20 nm or more and about 70 nm or less.

The length from a first layer to another adjacent first layer may be referred to as a bitline. The bitline pitch ($BP_L$) may vary and is not critical to the subject invention. The semiconductor structure 500 has any suitable bitline pitch that depends on, for example, the desired implementations and/or the semiconductor structure being fabricated. In one embodiment, the bitline pitch ($BP_L$) is about 50 nm or more and about 300 nm or less. In another embodiment, the bitline pitch ($BP_L$) is about 60 nm or more and about 200 nm or less. In yet another embodiment, the bitline pitch ($BP_L$) is about 70 nm or more and about 170 nm or less. In still yet another embodiment, the bitline pitch ($BP_L$) is about 90, 120, or 150 nm.

The unimplanted portion (e.g., channel) can have any suitable channel length ($C_L$) that depends on, for example, the desired implementations and/or the semiconductor structure 500 being fabricated. In one embodiment, the channel length ($C_L$) is about 10 nm or more and 150 nm or less. In another embodiment, the channel length ($C_L$) is about 15 nm or more and 100 nm or less. In yet another embodiment, the channel length ($C_L$) is about 20 nm or more and 70 nm or less. I still yet another embodiment, the channel length ($C_L$) is about 32, 45, or 55 nm.

After forming the implanted portion 602, the opening can be filled with the first layer material by any suitable filling techniques, for example, CVD. Examples of first layer materials include a HDP oxide or TEOS.

Figure 7:
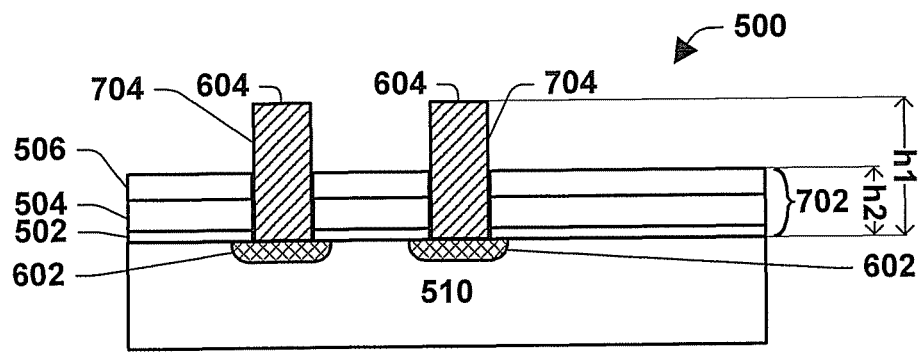
FIG. 7 illustrates forming a second layer on a semiconductor substrate in accordance with an aspect of the subject invention.

FIG. 7 illustrates forming a second layer 702 on the semiconductor substrate 510. In this example, the second layer 702 contains a first oxide layer 502, a nitride layer 504, and a second oxide layer 506. The second layer 702 is adjacent to the first layer 604, and the first layer 702 has a height (h1) larger than a height (h2) of the second layer 702 at the adjacent area. Since the first layer 702 has a height (h1) larger than a height (h2) of the second layer 702 at the adjacent area, the side surface 704 of the first layer 604 is exposed.

The second layer 702 can be formed by removing the second poly layer 508. The second poly layer 508 can be removed by any suitable techniques, for example, etching. For example, the second poly layer 508 can be removed by contacting the second poly layer 508 with any suitable polysilicon etchant that does not substantially remove the first layer 604. Examples of polysilicon etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Other polysilicon etchants can also be used as long as they are capable of removing the second poly layer 508 selective to the first layer 604. In one embodiment, when the first layer 604 contains silicon oxide, the polysilicon etchant has a selectivity of about 1,000:1 or more for polysilicon versus silicon oxide. In another embodiment, the polysilicon etchant has a selectivity of about 5,000:1 or more for polysilicon versus silicon oxide.

Figure 8:
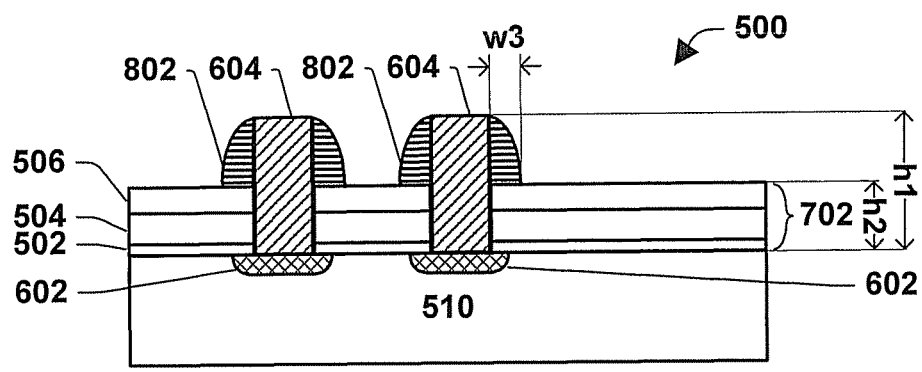
FIG. 8 illustrates forming a spacer adjacent a side surface of a first layer and on a portion of an upper surface of a second layer in accordance with an aspect of the subject invention.

FIG. 8 illustrates forming a spacer 802 adjacent a side surface 704 of the first layer 604 and on a portion of an upper surface of the second layer 702. In this example, the spacer 802 is formed over a side surface 704 of the first layer 604. The spacer 802 can be formed by forming a layer containing a spacer material over the first and second layers 604, 702, and then vertically etching the spacer material layer. In one embodiment, the spacer 802 can be formed by depositing a silicon nitride layer over the first and second layers 604, 702 by CVD, and then vertically etching the layer with reactive ion etching (e.g., $CF_4$ or $CHF_3$) leaving a portion at the adjacent area of the first and second layer 604, 702.

By way of example, forming the spacer 802 containing silicon nitride is described below. A silicon nitride layer is deposited to a thickness of about 200 Angstroms or more and about 300 Angstroms or less by low pressure CVD on the substantially entire surface of the substrate 510. Thereafter, a portion of the layer is removed by using reactive ion etching under the following conditions, thereby forming the silicon nitride spacer 802: a pressure of about 10 mTorr or more and about 2,000 mTorr or less; a RF power of about 100 W or more and 600 W or less; an etching gas flow of 40 sccm $CHF_3$, 90 sccm $CF_4$, 900 sccm Ar; a lower electrode temperature of about 0 degrees Celsius; and an etching time of about 1 second or more and about 2 minutes or less. In this example, the spacer 802 has a width (w3) of about 100 Angstroms or more and about 500 Angstroms or less.

Figure 9:
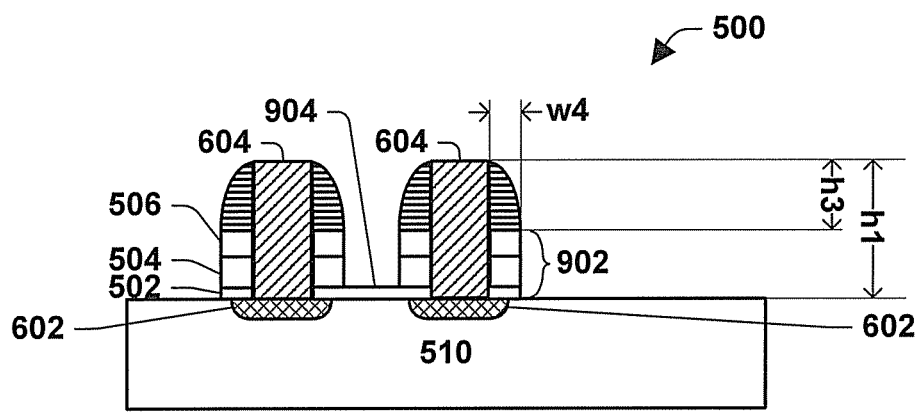
FIG. 9 illustrates forming a sub-lithographic charge storage element on a semiconductor substrate by removing exposed portions of a second layer not covered by a spacer in accordance with an aspect of the subject invention.

FIG. 9 illustrates forming a sub-lithographic charge storage element 902 on the semiconductor substrate 510. The sub-lithographic charge storage element 902 can be formed by removing the exposed portions of the second layer 702 (e.g., portions of second layer 702 that are not covered with the spacer 802). By leaving the portions of the second layer 702 that are adjacent the side surface 704 of the first layer 604, the left portions of the second layer 702 (e.g., sub-lithographic charge storage elements 902) are self-aligned to the first layers 604 and the implanted portions 602 (e.g., bitlines). The exposed portion of second layer 702 can be removed by, for example, contacting the semiconductor structure 500 with any suitable etchant under any suitable conditions that can remove the exposed portion of the second layer 702 but does not substantially remove the spacer-covered portion of the second layer 702.

When the second layer 702 is a multi layer, two or more different etchants can be used. Since, in this example, the exposed portion of second layer 702 contains the second oxide layer 506, the nitride layer 504, and the first oxide layer 502, hydrofluoric acid, phosphoric acid, and hydrofluoric acid can be used in sequence to remove the three layers, respectively. In one embodiment, the exposed portion of the second oxide layer 506 and the nitride layer 504 are removed and the exposed portion of the first oxide layer 502 remains. In another embodiment, substantially all of the three layers that are not covered by the spacer 802 are removed (not shown).

The exposed portion of the second oxide layer 506 can be removed by contacting the second oxide layer 506 with any suitable oxide etchant. Examples of oxide etchants include halogen acids such as hydrofluoric acid. In one embodiment, the oxide etchant is a hydrofluoric acid solution. In another embodiment, the oxide etchant is a vapor of hydrofluoric acid.

The hydrofluoric acid solution can contain a sufficient amount of hydrofluoric acid to facilitate removing the portion of the second oxide layer 506 from the semiconductor structure 500. In one embodiment, the hydrofluoric acid solution contains about 10% of hydrofluoric acid by weight or more and about 80% of hydrofluoric acid by weight or less. The exposed portion of the second oxide layer 506 is contacted with the hydrofluoric acid solution at a suitable temperature to facilitate removing the oxide. In one embodiment, the second oxide layer 506 is contacted with the hydrofluoric acid solution at a temperature of about 5 degrees Celsius or more and about 100 degrees Celsius or less. The second oxide layer 506 is contacted with the hydrofluoric acid solution for a suitable time to facilitate removing the oxide. In one embodiment, the second oxide layer 506 is contacted with the hydrofluoric acid solution for about 1 second or more and about 10 minutes or less.

The exposed portion of the nitride layer 504 can be removed by contacting the nitride layer 504 with any suitable nitride etchant. Examples of nitride etchants include phosphoric acid. The nitride layer 504 is contacted with a suitable nitride etchant under conditions that the etchant do not substantially remove or damage other components or layers of the semiconductor structure 500 such as the spacer 802.

The phosphoric acid solution may contain a sufficient amount of phosphoric acid to facilitate removing the exposed portion of the nitride layer 504 from the semiconductor structure 500. In one embodiment, the phosphoric acid solution contains about 70% of phosphoric acid by weight or more. Phosphoric acid may be diluted in water, such as de-ionized water, to produce the phosphoric acid solution having a desired concentration of phosphoric acid. The exposed portion of the nitride layer 504 is contacted with the phosphoric acid solution at a suitable temperature to facilitate removing the nitride. In one embodiment, the nitride layer 504 is contacted with the phosphoric acid solution at a temperature of about 5 degrees Celsius or more and about 100 degrees Celsius or less. The nitride layer 504 is contacted with the phosphoric acid solution for a suitable time to facilitate removing the oxide. In one embodiment, the nitride layer 504 is contacted with the phosphoric acid solution for about 1 second or more and about 10 minutes or less.

If necessary, the exposed portion of the first oxide layer 502 can be removed by contacting the first oxide layer 502 with any suitable oxide etchant. For example, the first oxide layer can be removed under the conditions as described above for removing the exposed portion of the second oxide layer 506.

The width (w4) of the sub-lithographic charge storage element 902 can be controlled and/or determined primarily by the specific identity of the spacer material and the width (w3) of the spacer 802. The sub-lithographic charge storage element 902 can have any suitable width (w4) that depends on, for example, the desired implementations and/or the semiconductor structure 500 being fabricated. In this example, the sub-lithographic charge storage element 902 has a width (w4) of about 100 Angstroms or more and about 500 Angstroms or less.

In one embodiment, while etching the exposed portion of the second layer 702, portions (e.g., upper portions) of the first layer 604 and/or the spacer 802 can be also etched. In another embodiment, after removing the exposed portion of the second layer 702, portions (e.g., upper portions) of the first layer 604 and/or the spacer 802 can be etched. The first layer 604 and/or the spacer 802 can be etched partially so that the heights (h1) of the first layer 604 and/or the height (h3) of the spacer 802 are reduced. The height (h1) of the first layer 604 and/or the height (h3) of the spacer 802 can be reduced, for example, to minimize surface topology of the semiconductor structure 500.

In one embodiment, while removing the exposed portion of the second layer 702, the height (h1) of the first layer 604 and/or the height (h3) of the spacer 802 are reduced to about 100 Angstroms or more and 1,000 Angstroms or less. In another embodiment, while removing the exposed portion of the second layer 702, the height (h1) of the first layer 604 and/or the height (h3) of the spacer 802 are reduced to about 200 Angstroms or more and 900 Angstroms or less. In yet another embodiment, while removing the exposed portion of the second layer 702, the height (h1) of the first layer 604 and/or the height (h3) of the spacer 802 are reduced to about 300 Angstroms or more and 800 Angstroms or less. In yet another example, while etching the exposed portion of the second layer 702, the whole portion of the spacer 802 can be also etched away.

Figure 10:
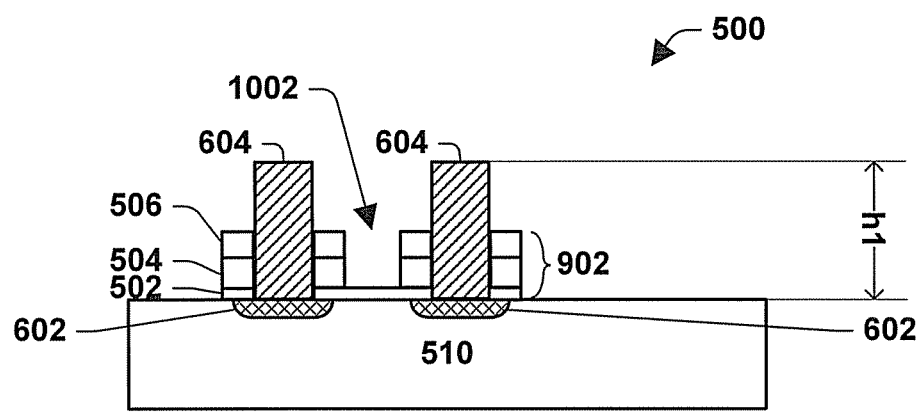
FIG. 10 illustrates removing a spacer from a semiconductor structure in accordance with an aspect of the subject invention.

FIG. 10 illustrates removing the spacer 802 from the exemplary semiconductor structure 500. If the spacer 802 remains after removing the exposed portion of the second layer 702, and removal of the spacer 802 is necessary, the spacer 802 can be removed by, for example, etching. In one embodiment, the spacer 802 is removed by contacting the spacer 802 with a suitable etchant that does not substantially remove or damage other components of the semiconductor structure 500 such as the sub-lithographic charge storage element 902. In one embodiment, when the spacer 802 contains silicon nitride, the spacer 802 can be removed by contacting the spacer 802 with a nitride etchant.

In one embodiment, while etching the spacer 802, portions (e.g., upper portions) of the first layer 604 can be etched so that the height (h1) of the first layer 604 is reduced. In another embodiment, after removing the spacer 802, portions (e.g., upper portions) of the first layer 604 and/or the spacer 802 can be etched. The height (h1) of the first layer 604 can be reduced, for example, to minimize surface topology of the semiconductor structure 500. In one embodiment, the height (h1) of the first layer 604 is reduced to about 100 Angstroms or more and 1,000 Angstroms or less. In another embodiment, the height (h1) of the first layer 604 is reduced to about 200 Angstroms or more and 900 Angstroms or less. In yet another embodiment, the height (h1) of the first layer 604 is reduced to about 300 Angstroms or more and 800 Angstroms or less. When the first layer 604 contains HDP oxide or TEOS, the upper portion of the first layer 604 can be removed by contacting the first layer with any suitable oxide etchant such as halogen acids (e.g., hydrofluoric acid).

Although not shown, an oxide layer can be formed over the substrate 510 after removing the spacer 802. For example, an oxide layer can be formed at a portion 1002 between the sub-lithographic charge storage elements 902 on the top of the oxide layer 502. Any suitable oxide material can be employed for the oxide layer. Examples of oxide material include a high temperature oxide, low temperature oxide, and the like. In one embodiment, the oxide layer is grown in plasma at low temperatures, e.g., plasma-grown oxide. For example, the oxide layer contains plasma-grown oxide that is grown at a temperature of about 250 degrees Celsius or more and about 600 degrees Celsius or less. In another embodiment, the oxide layer is formed using a Slot Plane Antenna (SPA) process. In the SPA process, plasma-grown oxide is grown in a chamber that includes a microwave slot antenna, which is used to generate the plasma. The microwave slot antenna can be configured to provide a plasma distribution that results in a plasma-grown oxide that has increased uniformity, conformity, and quality compared to conventional plasma oxide. In the SPA process, the species used to grow the oxide can contain one or more of oxygen, argon, or hydrogen, for example. In yet another embodiment, the oxide layer is a steam oxide that is grown on the surface of a silicon substrate (e.g., substrate 510) by heating the substrate in the presence of steam.

Figure 11:
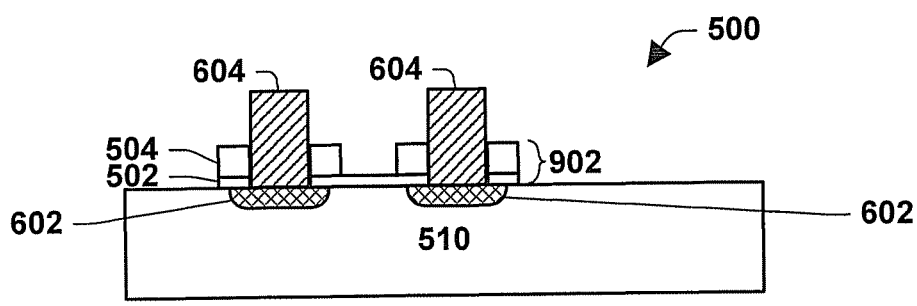
FIG. 11 illustrates removing a second oxide layer of a sub-lithographic charge storage element from a semiconductor structure in accordance with an aspect of the subject invention.

FIG. 11 illustrates removing the remaining portion of the second oxide layer 506 from the exemplary semiconductor structure 500. If necessary, the remaining portion of the second oxide layer 506 can be removed by, for example, etching. The remaining portion of the second oxide layer 506 can be removed by contacting the remaining portion of the second oxide layer 506 with a suitable etchant that does not substantially remove and damage other components of the semiconductor structure 500 such as the sub-lithographic charge storage element 902. The remaining portion of the second oxide layer 506 can be removed under the conditions as described above for removing the exposed portion of the second oxide layer 506 that is not covered with the spacer 802 in connection with FIG. 9. In one embodiment, while the remaining portion of the second oxide layer 506 is etched, the upper portion of the first layer 604 can be also etched, for example, to minimize surface topology of the semiconductor structure 500. In this example, the sub-lithographic charge storage element 902 contains a portion of the first oxide layer 502 and a portion of the nitride layer 504.

Figure 12:
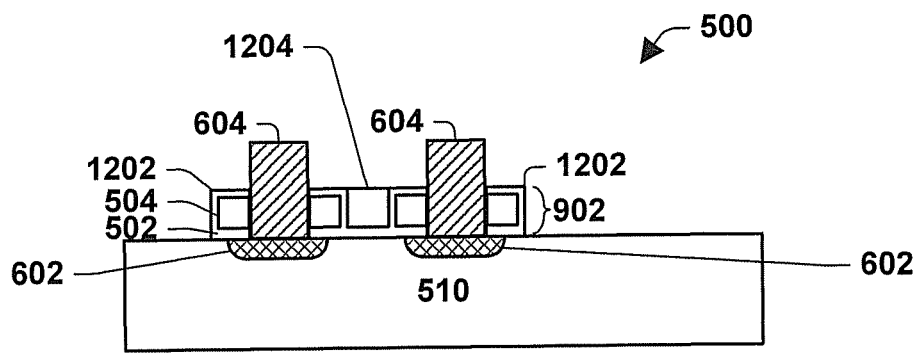
FIG. 12 illustrates forming a top oxide layer on a nitride layer on a semiconductor structure in accordance with an aspect of the subject invention.

FIG. 12 illustrates forming a top oxide layer 1202 on the surface of the nitride layer 504 and a dielectric layer 1204 between the sub-lithographic charge storage elements 902 on the exemplary semiconductor structure 500. If necessary, the top oxide layer 1202 can be formed on the surface of the nitride layer 504 by, for example, oxidation of the nitride layer 504.

The dielectric layer 1204 can be formed at a portion between the sub-lithographic charge storage elements 902 over the substrate 510. Examples of dielectric layer materials include oxides. Any suitable oxide material can be employed.

Examples of oxide materials include a high temperature oxide, low temperature oxide, and the like. The oxide layer can be formed under the conditions as described above for forming the oxide layer in connection with FIG. 10 at a portion 1002. In this example, the sub-lithographic charge storage element 902 contains a portion of the first oxide layer 502, a portion of the nitride layer 504, and the top oxide layer 1202.

Figure 13:
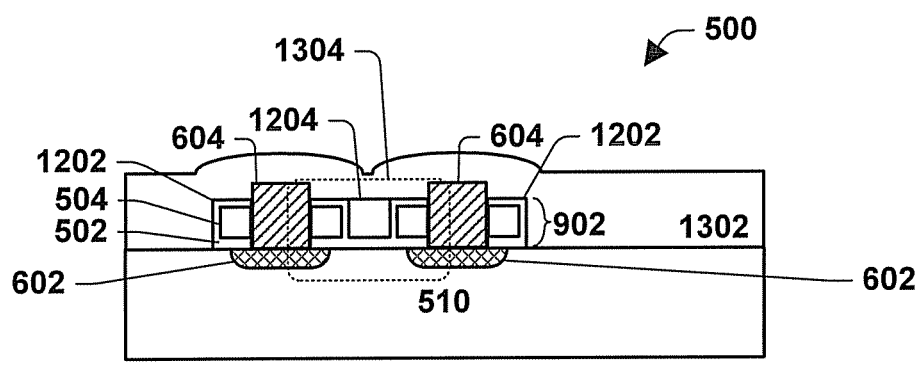
FIG. 13 illustrates forming a layer over a sub-lithographic charge storage element on a semiconductor substrate in accordance with an aspect of the subject invention.

FIG. 13 illustrates forming at least one layer 1302 over the sub-lithographic charge storage element 902 on the semiconductor substrate 510, thereby forming a memory cell 1304. The layer 1302 can be formed on the semiconductor substrate 510 by any suitable formation technique. The layer 1302 may be referred to as a top gate.

In one embodiment, the layer 1302 is a second poly layer. The second poly layer 1302 typically contains polysilicon. The second poly layer 1302 can be formed on the semiconductor substrate 510 by, for example, CVD. The second poly layer 1302 can have any suitable thickness that depends on, for example, the desired implementations and/or the semiconductor structure 500 being fabricated. In one embodiment, the second poly layer 1302 has a thickness of about 500 Angstroms or more and 5,000 Angstroms or less. In another embodiment, the second poly layer 1302 has a thickness of about 700 Angstroms or more and 4,000 Angstroms or less. In yet another embodiment, the second poly layer 1302 has a thickness of about 900 Angstroms or more and 3,000 Angstroms or less.

In another embodiment, a multi-layer is formed over the sub-lithographic charge storage element 902 on the semiconductor substrate 510. For example, a bi-layer 1302 containing an aluminum oxide (e.g., $Al_2O_3$) layer and tantalum (e.g., tantalum nitride) layer is formed on the semiconductor substrate 510. The aluminum oxide layer and tantalum layer can be formed on the semiconductor substrate 510 by any suitable formation techniques, for example, CVD. The aluminum oxide layer has any suitable thickness that depends on, for example, the desired implementations and/or the semiconductor structure 500 being fabricated. In one embodiment, the aluminum oxide layer has a thickness of about 500 Angstroms or more and 5,000 Angstroms or less. In another embodiment, the aluminum oxide layer has a thickness of about 700 Angstroms or more and 4,000 Angstroms or less. In yet another embodiment, the aluminum oxide layer has a thickness of about 900 Angstroms or more and 3,000 Angstroms or less.

The tantalum layer has any suitable thickness that depends on, for example, the desired implementations and/or the semiconductor structure 500 being fabricated. In one embodiment, the tantalum layer has a thickness of about 500 Angstroms or more and 5,000 Angstroms or less. In another embodiment, the tantalum layer has a thickness of about 700 Angstroms or more and 4,000 Angstroms or less. In yet another embodiment, the tantalum layer has a thickness of about 900 Angstroms or more and 3,000 Angstroms or less. When an aluminum oxide layer and tantalum layer are formed on the semiconductor substrate 510, the resultant semiconductor structure 500 contains the tantalum layer and aluminum oxide layer over the sub-lithographic charge storage element 902 on the semiconductor substrate 510.

The memory cell 1304 contains the two sub-lithographic charge storage elements 902 and dielectric layer 1204 between the two sub-lithographic charge storage elements 902 on the semiconductor substrate 510; the implanted portions 602 of the semiconductor substrate 510 under the two sub-lithographic charge storage elements 902; and the top gate 1302 over the two sub-lithographic charge storage elements 902 and dielectric layer 1204. Since the memory cell 1304 has the two sub-lithographic charge storage elements 902 separated by the dielectric layer 1204, the memory cell 1304 can store two physically distinct bits. Each bit within the memory cell 1304 serves as a binary unit of data (e.g., either 1 or 0) that can be mapped directly to a memory array. Reading or programming one side of sub-lithographic charge storage elements 902 occurs independently of whatever data is stored on the opposite side of the sub-lithographic charge storage elements 902. Moreover, the dielectric layer 1204 can prevent and/or mitigate undesirable signal crossover (e.g., crosstalk) between the two sub-lithographic charge storage elements 902. As a result, the memory cell 1304 can provide exceptional read and write performance.

Figure 14:
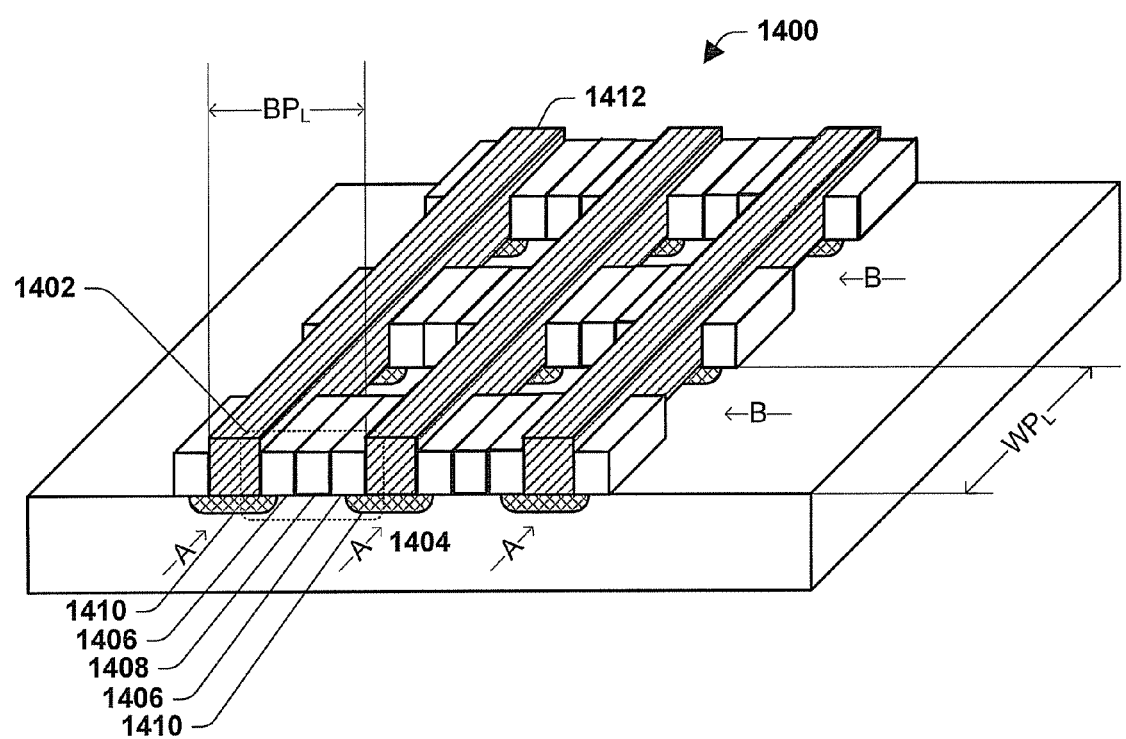
FIG. 14 illustrates a perspective view of a semiconductor structure containing two or more memory cells on a semiconductor substrate in accordance with an aspect of the subject invention.

FIG. 14 illustrates a perspective view of a semiconductor structure 1400 containing two or more memory cells 1402 on a semiconductor substrate 1404. The memory cell 1402 contains two sub-lithographic charge storage elements 1406 and a dielectric layer 1408 between the two sub-lithographic charge storage elements 1406; implanted portions 1410 of the semiconductor substrate 1404 under the two sub-lithographic charge storage elements 1406; and the top gate (not shown) over the sub-lithographic charge storage elements 1402. The two or more memory cells 1402 are separated by first layers 1412.

The portion as indicated by arrows A where the first layer 1412 lines may be referred to as a bitline. The bitline pitch ($BP_L$) may vary and is not critical to the subject invention. Any suitable bitline pitch can be employed. The bitline pitch may depend on, for example, the desired implementations and/or the semiconductor structure being fabricated. For example, the bitline pitch ($BP_L$) is any of the bitline pitches as described in connection with FIG. 6.

Two or more memory cells 1400 separated by first layers 1412 can form a row and two or more rows can be disposed on the semiconductor substrate. The two or more rows are separated by wordlines (not shown) that locate at positions as indicated by arrows B. The wordlines can contain any suitable dielectric material such as a HDP oxide.

The length from a row to another adjacent row may be referred to as a wordline pitch. The wordline pitch ($WP_L$) may vary and is not critical to the subject invention. Any suitable wordline pitch can be employed. The wordline pitch may depend on, for example, the desired implementations and/or the semiconductor structure being fabricated. In one embodiment, the wordline pitch ($WP_L$) is about 50 nm or more and about 300 nm or less. In another embodiment, the wordline pitch ($WP_L$) is about 60 nm or more and about 200 nm or less. In yet another embodiment, the wordline pitch ($WP_L$) is about 70 nm or more and about 170 nm or less. In still yet another embodiment, the wordline pitch is about 90, 120, or 150 nm.

Figure 15:
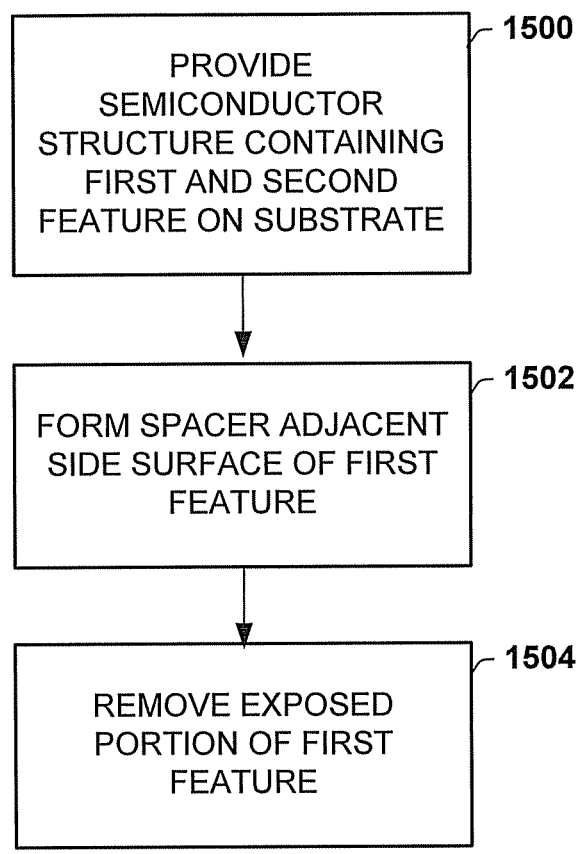
FIG. 15 illustrates an exemplary methodology for forming a sub-lithographic charge storage element on a semiconductor substrate in accordance with an aspect of the subject invention.

FIG. 15 illustrates an exemplary methodology of forming a sub-lithographic charge storage element on a semiconductor substrate. At 1500, a semiconductor structure containing a first layer and a second layer on a semiconductor substrate is provided. The first and second layers are adjacent to each other on the substrate. The first layer has the height larger than the height of the second layer at the adjacent area. The second layer contains a charge-trapping layer. The charge-trapping layer typically contains a nitride material such as a silicon nitride.

At 1502, a spacer is formed adjacent a side surface (e.g., sidewall) of the first layer and on a portion of an upper surface of the second layer. At 1504, the exposed portion of the second layer not covered by the spacer is removed, thereby forming a sub-lithographic charge storage element on the substrate.

Although not shown, the methodology of FIG. 15 may include any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures.

The resultant semiconductor structure formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant semiconductor structure formed herein is useful in any electronic device such as a memory. For example, the resultant semiconductor structure is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A memory cell comprising:
a first bitline element and a second bitline element co-located on a semiconductor substrate surface;
a first sub-lithographic charge storage element and a second sub-lithographic charge storage element located between the first bitline element and the second bitline element, and a dielectric layer located between the first sub-lithographic charge storage element and the second sub-lithographic charge storage element;
a first implanted portion of the semiconductor substrate located under the first sub-lithographic charge storage element and a second implanted portion of the semiconductor substrate located under the second sub-lithographic charge storage element; and
a top gate over the first sub-lithographic charge storage element, the second sub-lithographic charge storage element and dielectric layer.

2. The memory cell of claim 1, wherein the first sub-lithographic charge storage element and the second sub-lithographic charge storage element each having a width of about 100 Angstroms or more and about 500 Angstroms or less.

3. The memory cell of claim 1, wherein the first sub-lithographic charge storage element and the second sub-lithographic charge storage element each comprise silicon nitride.

4. The memory cell of claim 1, wherein the dielectric layer comprises an oxide material and the top gate comprises a poly or tantalum.

5. The memory cell of claim 1, wherein the first sub-lithographic charge storage element and the second sub-lithographic charge storage element each comprise a nitride.

6. The memory cell of claim 1, wherein the first sub-lithographic charge storage element and the second sub-lithographic charge storage element each comprise silicon nitride and silicon oxide.

7. A memory cell comprising:
two bitline elements on a semiconductor substrate;
two sub-lithographic charge storage elements between the two bitline elements on the semiconductor substrate;
a dielectric layer between the two sub-lithographic charge storage elements on the semiconductor substrate;
implanted portions of the semiconductor substrate under the two sub-lithographic charge storage elements; and
a top gate over the two sub-lithographic charge storage elements and dielectric layer.

8. The memory cell of claim 7, wherein the sub-lithographic charge storage element has a width of about 100 Angstroms or more and about 500 Angstroms or less.

9. The memory cell of claim 7, wherein the sub-lithographic charge storage element is formed by removing an exposed portion of a second layer not covered by a spacer.

10. The memory cell of claim 7, wherein the sub-lithographic charge storage element comprises a nitride layer and a oxide layer, one side surface of the nitride layer being in contact with a side surface of the bitline element, another side surface and upper and bottom surfaces of the nitride layer being in contact with the oxide layer.

11. The memory cell of claim 10, wherein the oxide layer under the nitride layer is a silicon oxide layer, and the oxide layer over the upper and side surfaces of the nitride layer is an oxidation product of the surfaces of the nitride layer.

12. The memory cell of claim 7, wherein the bitline element has a height larger than a height of the sub-lithographic charge storage element.

13. The memory cell of claim 7, wherein the dielectric layer comprises an oxide material and the top gate comprises a poly or tantalum.

14. A semiconductor structure comprising two or more memory cells, the memory cell comprising:
two bitline elements on a semiconductor substrate;
two sub-lithographic charge storage elements between the two bitline elements on the semiconductor substrate;
a dielectric layer between the two sub-lithographic charge storage elements on the semiconductor substrate;
implanted portions of the semiconductor substrate under the two sub-lithographic charge storage elements; and
a top gate over the two sub-lithographic charge storage elements and dielectric layer.

15. The semiconductor structure of claim 14, wherein the sub-lithographic charge storage element has a width of about 100 Angstroms or more and about 500 Angstroms or less.

16. The semiconductor structure of claim 14, wherein the sub-lithographic charge storage element is formed by removing an exposed portion of a second layer not covered by a spacer.

17. The semiconductor structure of claim 14, wherein the sub-lithographic charge storage element comprises a nitride layer and a oxide layer, one side surface of the nitride layer being in contact with a side surface of the bitline element, another side surface and upper and bottom surfaces of the nitride layer being in contact with the oxide layer.

18. The semiconductor structure of claim 14, wherein the oxide layer under the nitride layer is a silicon oxide layer, and the oxide layer over the upper and side surfaces of the nitride layer is an oxidation product of the surfaces of the nitride layer.

19. The semiconductor structure of claim 14, wherein the bitline element has a height larger than a height of the sub-lithographic charge storage element.

20. The semiconductor structure of claim 14, wherein the dielectric layer comprises an oxide material and the top gate comprises a poly or tantalum.

* * * * *